(12) United States Patent
Park et al.

(10) Patent No.: US 7,115,979 B2
(45) Date of Patent: Oct. 3, 2006

(54) LIGHT EMITTING DIODE PACKAGE

(75) Inventors: Jung Kyu Park, Kyungki-do (KR);
Young Sam Park, Seoul (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 58 days.

(21) Appl. No.: 10/954,144

(22) Filed: Sep. 30, 2004

(65) Prior Publication Data
US 2005/0280014 A1    Dec. 22, 2005

(30) Foreign Application Priority Data
Jun. 16, 2004    (KR)    ............ 10-2004-0044668

(51) Int. Cl.
*H01L 23/495*    (2006.01)
(52) U.S. Cl. .......... 257/676; 257/98; 257/E25.032
(58) Field of Classification Search .......... None
See application file for complete search history.

(56) References Cited

U.S. PATENT DOCUMENTS 5,285,678 A * 2/1994 McDaniel et al. .......... 73/49.3
6,903,380 B1 * 6/2005 Barnett et al. .......... 257/98
2002/0113244 A1  8/2002 Barnett et al.
2003/0067264 A1  4/2003 Takekuma

FOREIGN PATENT DOCUMENTS

JP    2003-124525    4/2003

* cited by examiner

*Primary Examiner*—Nathan J. Flynn
*Assistant Examiner*—Scott R Wilson
(74) *Attorney, Agent, or Firm*—Lowe, Hauptman & Berner, LLP.

(57) ABSTRACT

An LED package in which an LED chip a body has a cup part housing an LED chip. The cup part has a step formed in the outer circumference of the top thereof. A lens is mounted on the cup part, and has a flange extended downward from the outer circumference of the lens along the outside wall of the cup part to form a gap between the flange and the downward step of the cup part and to seal the gap from the outside. Resin material fills a space formed between the underside of the lens and the cup part and at least partially the gap formed between the step of the cup part and the lens flange. The resin material is prevented from leaking out of the LED package. The LED package of the invention prevents the creation of voids in the resin material surrounding the LED chip or the leakage of the resin material to the outside.

15 Claims, 5 Drawing Sheets

LIGHT EMITTING DIODE PACKAGE

RELATED APPLICATION

The present application is based on, and claims priority from, Korean Application Number 2004-44668, filed Jun. 16, 2004, the disclosure of which is hereby incorporated by reference herein in its entirety.

BACKGROUND OF THE INVENTION

1. Field of the Invention

The present invention relates to a light emitting diode package, more particularly, capable of preventing the creation of voids in resin material surrounding a light emitting diode chip or the leakage of resin material to the outside.

2. Description of the Related Art

Recently various approaches are under development to substitute various conventional light sources for illumination with a Light Emitting Diode (LED) thanks to its rapid improvement in efficiency and brightness. For the purpose of this, high brightness and power LEDs which overwhelm conventional diodes with size and input voltage are being developed and commercialized also.

One subject to be noticed is a packaging method for enabling an LED to stably operate in high brightness and power conditions. From this point of view, silicone-based resin material has been observed. The silicone-based resin material has excellent optical properties since it is resistive to yellowing, that is, change in quality induced by single wavelength light and has high refractivity. Unlike epoxy which is to be solidified, the silicone-based rein material still maintains a gel or elastomer state even after being cured, and thus can stably protect a diode against impact or vibration.

In application of silicone to an LED package, transparent silicone gel is injected with a dispenser into a space between a lens and a cup-shaped cavity of a package body where an LED chip and a lens are assembled in their order into the cup-shaped cavity of the package body.

However, the injection technique has a high probability that silicone may not completely fill up the cavity creating voids or bubbles. Further, bubbles also may be generated from gas residing between the chip and an underlying substrate or by the gravity. The voids or bubbles function as one of major factors which degrade optical properties of a final LED package.

In order to prevent the formation of voids or bubbles within a cavity, there was proposed an approach disclosed in Japanese Patent Publication No. 2003-124525 and U.S. patent application No. 2003/0067264 claiming the benefit of the former, entitled "Light-Emitting Diode and Method for Its Production."

FIG. 1A is a sectional view illustrating an LED diode disclosed in the above documents, and FIG. 1B is an exploded view of the LED diode shown in FIG. 1A.

Referring to FIGS. 1A and 1B, an LED 10 includes an LED chip 50, a base 30 housing the LED chip 50 and a lens member 20 mounted on the base 30. The base 30 has a cup part 31 with a concave structure, and the LED chip 50 is held and mounted inside the cup part 31. The base 30 is worked into a predetermined shape for example by grinding ceramic material or molding plastic.

Wires 41 and 42 are formed on the surface of the base 30. One ends of the wires 41 and 42 are extended into the cup part 31 to form chip-connecting parts 45 and 46 for electrical connection to the LED chip 50 within the cup part 31, respectively.

The lens member 20 mounted on the base 30 is made of transparent material, and has outer and inner convex parts 24 and 25.

The resin material or chip coating material 70 is filled inside the cup part 31. Resin material 70 has the effect of adhering and anchoring the lens member 20 and preventing the deterioration of light-emitting diode chip 50.

The surface of the resin material 70 is represented by the reference numeral 71 right after the resin material 70 is filled into the cup part 31. When the lens member 20 is mounted on the base 30, the surface of the resin material 70 is changed as represented by the reference numeral 72 in FIG. 1B to match the surface of the inner convex part 25 of the lens member 20. As a result, this eliminates any hollow space that may form into voids within the cup part 31 thereby to obtain excellent sealing properties.

Further, the inner convex part 25 of the lens member 20 may be provided with a pair of grooves (not shown) for introducing a portion of the resin material 70 extruded out by the lens member 20 by which fine sealing properties may be easily achieved.

However, the above-described LED 10 of the prior art has the following disadvantages. First, if the resin material 70 is filled by an excessively large quantity, the resin material 70 may leak along the grooves (not shown) out of the LED 10 to soil the exterior of the LED 10.

Second, since the lens member 20 when mounted on the body 30 is to be pressed downward at a desired pressure until the resin material 70 is sufficiently bonded to the lens member 20, this prior art structure needs additional pressing means.

SUMMARY OF THE INVENTION

The present invention has been made to solve the foregoing problems of the prior art and it is therefore an object of the present invention to provide an LED package capable of preventing the creation of voids in resin material surrounding an LED chip or the leakage of the resin material to the outside.

It is another object of the present invention to provide an LED package comprising fastening means which can securely hold a lens unit with respect to a body while resin material is being cured to bond the lens unit to the body.

According to an aspect of the present invention for realizing the object, there is provided a Light Emitting Diode (LED) package comprising: an LED chip; a body having a cup part housing the LED chip, the cup part having a step formed in the outer circumference of the top thereof; a lens mounted on the cup part, and having a flange extended downward from the outer circumference of the lens along the outside wall of the cup part to form a gap between the flange and the downward step of the cup part and to seal the gap from the outside; and resin material filling a space formed between the underside of the lens and the cup part and at least partially the gap formed between the step of the cup part and the lens flange, whereby the resin material is prevented from leaking out of the LED package.

Preferably, the step may be formed integrally along the entire outer circumference of the top of the cup part.

Preferably, the step may comprise a plurality of step parts spaced at a predetermined gap along the outer circumference of the top of the cup part.

The LED package of the invention may further comprise fastening means which include a hook extended from the bottom of the lens flange and a projection projected from the outside wall of the body fastened into the hook.

Preferably, the outer circumference of the lens is laterally projected from the lens and bent downward to form the flange.

According to another aspect of the present invention for realizing the object, there is provided a an LED chip; a body having a cup part housing the LED chip, the cup part having a groove formed in the outer circumference of the top thereof; a lens mounted on the cup part, and having a flange extended downward from the outer circumference of the lens along the outside wall of the cup part to seal the groove of the cup part from the outside; and resin material filling a space formed between the underside of the lens and the cup part and at least partially the groove of the cup part, whereby the resin material is prevented from leaking out of the LED package.

Preferably, the groove may be formed integrally along the entire outer circumference of the top of the cup part.

Preferably, the groove may comprise a plurality of groove parts spaced at a predetermined gap along the outer circumference of the top of the cup part.

The LED package of the invention may further comprise fastening means which include a hook extended from the bottom of the lens flange and a projection projected from the outside wall of the body fastened into the hook.

Preferably, the outer circumference of the lens is laterally projected from the lens and bent downward to form the flange.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

A preferred embodiment of the present invention will now be described in detail with reference to the accompanying drawings.

Figure 1A:
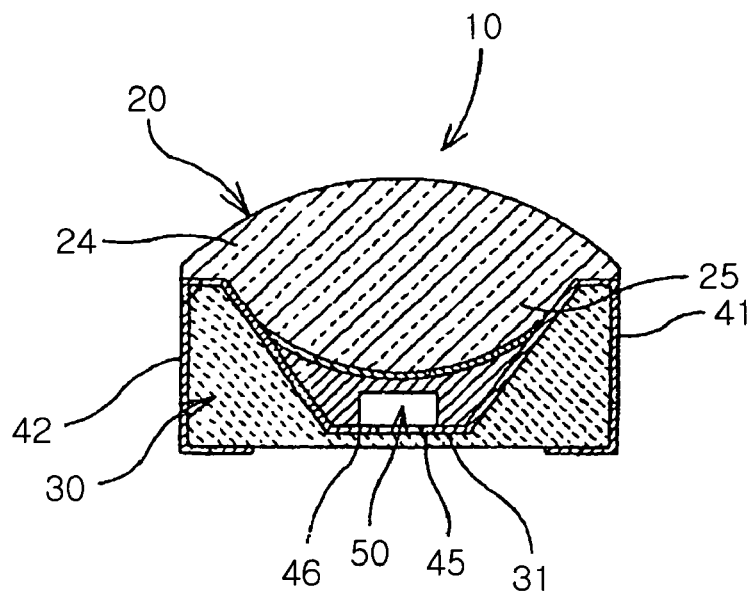
FIG. 1A is a sectional view of an LED package of the prior art.
Figure 1B:
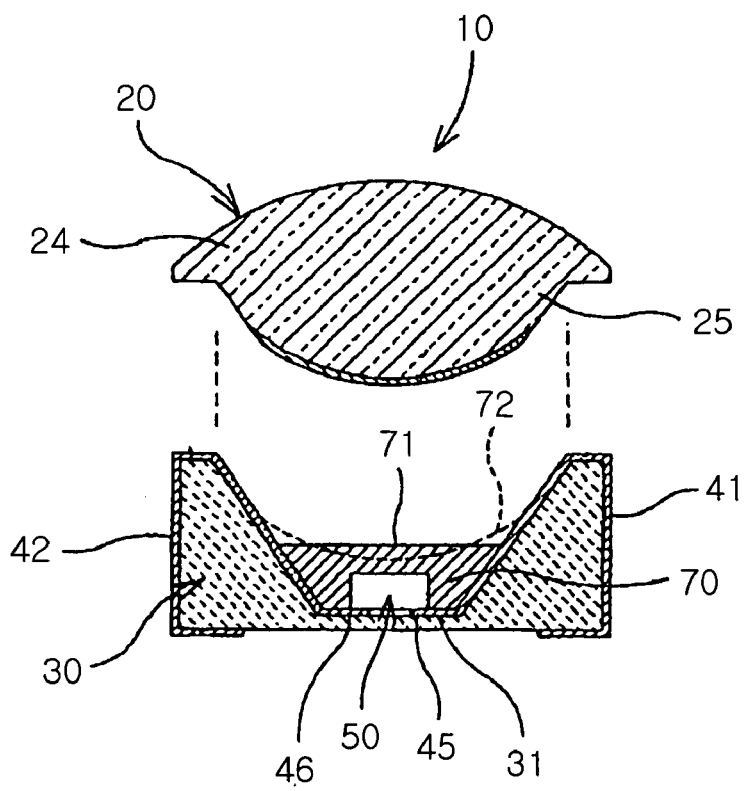
FIG. 1B is an exploded view of the LED package shown in FIG. 1A.
Figure 2:
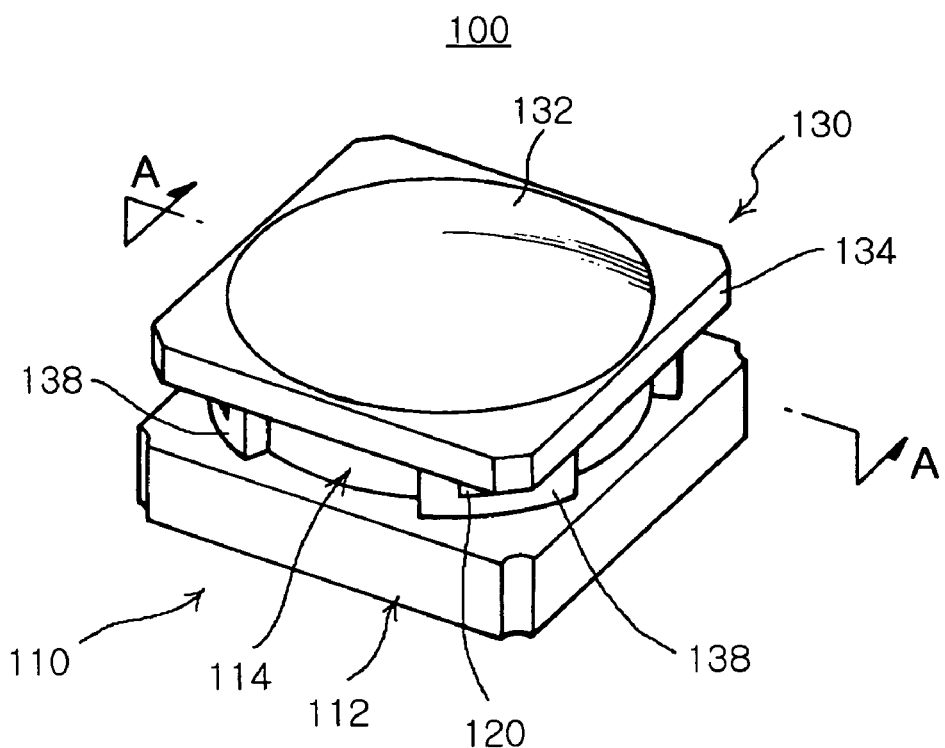
FIG. 2 is a perspective view of a high power LED package according to a first embodiment of the present invention.
Figure 3:
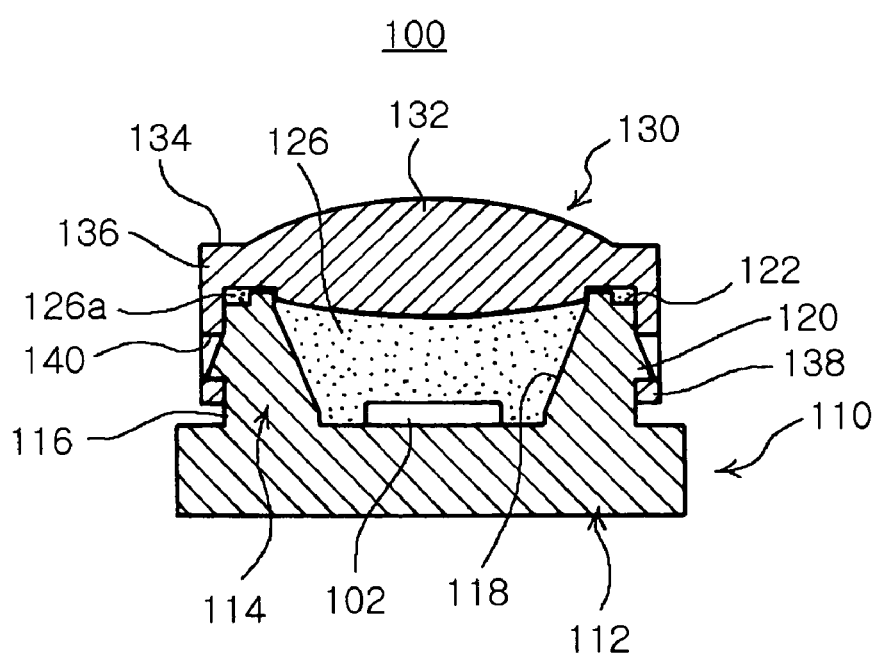
FIG. 3 is a sectional view taken along the line A—A of the high power LED package shown in FIG. 2.
Figure 4:
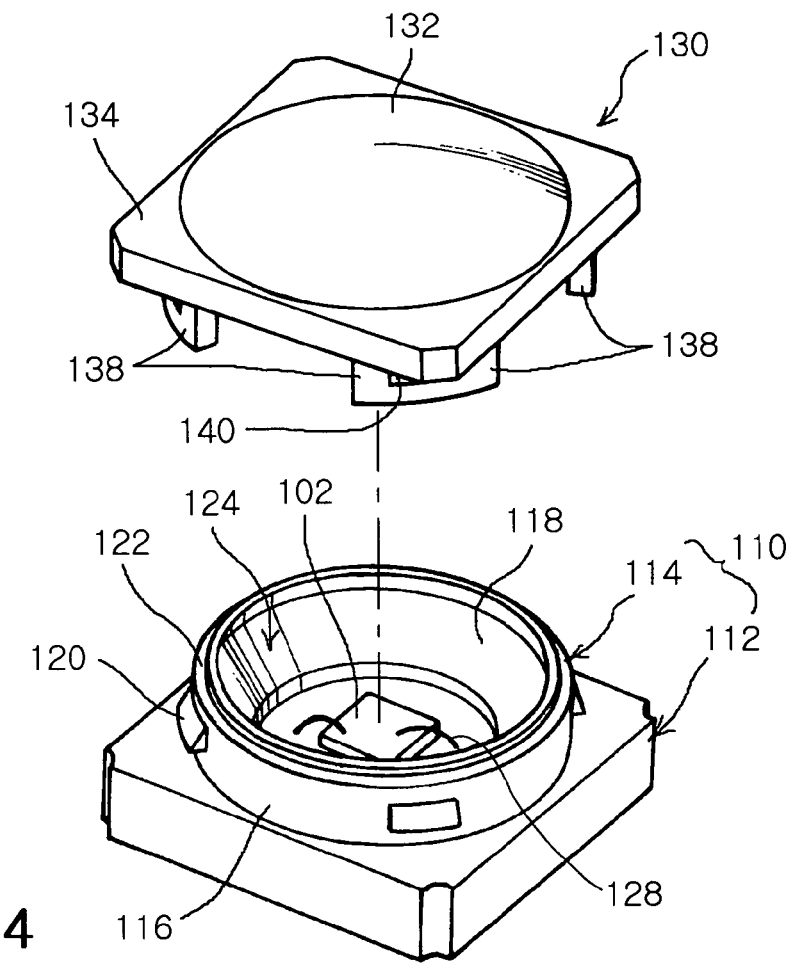
FIG. 4 is an exploded perspective view of the high power LED package shown in FIG. 2.
Figure 5:
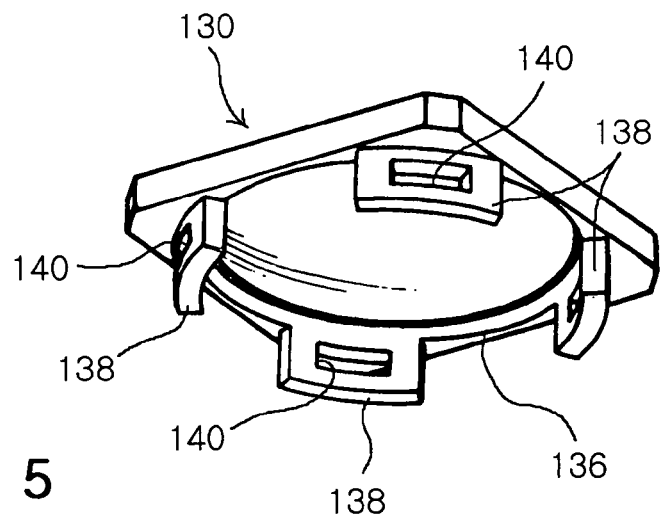
FIG. 5 is a bottom perspective view of the high power LED package shown in FIG. 2.

FIG. 2 is a perspective view of a high power LED package according to a first embodiment of the present invention, FIG. 3 is a sectional view taken along the line A—A of the high power LED package shown in FIG. 2, FIG. 4 is an exploded perspective view of the high power LED package shown in FIG. 2, and FIG. 5 is a bottom perspective view of the high power LED package shown in FIG. 2.

Referring to FIGS. 2 to 5, a high power LED package 100 according to the first embodiment of the present invention includes a package body 110 mounted with an LED chip 102, resin material 126 filled into the body 110 while sealing the LED chip 102 and a lens unit 130 fixedly mounted on the body 110.

The body 110 includes a substantially square base 112 and a cylindrical cup part 114 provided integrally in an upper portion of the base 112. The cup part 114 has an outside wall 116 which is extended upward substantially perpendicularly from the base 112 and an inside wall 118 which is extended upward and expanded outward at a predetermined angle from the base 112. The inside wall 118 cooperates with an upper part of the base 112 placed therein to form a cavity 124 for seating or housing the LED chip 102 therein. The body 110 of the above structure is typically made of for example ceramic or plastic, and may be formed into the above described configuration or any equivalent ones via for example cutting or molding.

A step 122 is formed integrally along the entire outer circumference of the top of the cup part 114. The step 122 cooperates with a downward flange 136 of the lens unit 130 to form a leakage proof structure for preventing leakage of resin material, which will be described later in connection with the downward flange 136.

Preferably, a plurality of projections 120 are projected from the outside wall 116 of the cup part 114. The projections 120 cooperate with hooks 138 of the lens unit 130 to form fastening means, which will be described hereinafter in detail in connection with the hooks 138.

The LED chip 102 mounted on the base 112 within the cavity 124 are electrically connected with an external power supply via a pair of wires 128. The wires 128 are made of a material having excellent electric conductivity such as Au and Ag. Each of the wires 128 is connected at one end with a terminal (not shown) of the LED chip 102 within the cavity 124 and at the other end with the external power supply.

While it has been described that the LED chip 102 is directly mounted on the base 112, a submount or substrate made of insulator such as silicone may be alternatively mounted on the base 112 to seat the LED chip 102 thereon in order to relieving the LED chip 102 from any external impact transmitted via the base 112.

The resin material 126 is filled inside the cavity 124 of the cup part 114. The resin material 126 is fixedly bonded to the lens unit 130, and functions to protect the LED chip 102 while preventing the deterioration thereof. The resin material 126 is made of silicone gel or elastomer, and may selectively contain UV absorbent and/or phosphor.

The lens unit 130 mounted on the top of the cup part 114 of the body 110 is made of transparent material, and top and bottom faces of a lens 132 may be curved at the same curvature or different curvatures.

The circumference of the lens 132 is further extended in a lateral direction to form a substantially square rim part 134, and then extended downward to form the flange 136 matching around the outside wall 116 of the cup part 114. That is, as shown in FIG. 3, when the lens unit 130 is coupled with the cup part 114 of the body 110, the flange 136 tightly contacts the outside wall 116 of the cup part 114 to grasp the cup part 114 so that a gap defined by the step 122 in the top of the cup part 114 and the flange 136 is sealed from the outside. As a consequence, this structure prevents a resin material portion 126a partially existing in the gap from leaking to the outside. While it has been described that the step 122 is extended integrally along the entire upper outer circumference of the cup part 114, the step 122 may be divided into a plurality of step parts spaced from one another along the upper circumference of the cup part 114 on condition that they afford enough spaces to contain the resin material portion 126a overflown from the cup part 114.

While the prior art has a drawback in that resin material may leak to the outside when the lens member is mounted on the cup part, the leakage proof structure by the flange 136 and the step 122 of the present invention completely prevents the resin material portion 126a from leaking from the cup part 114 to the outside.

Upon being cured to a desired level, the resin material portion 126a existing along the gap is shaped into an O-ring matching the configuration of the gap, which in turn reinforces the bonding between the lens unit 130 and the cup part 114 to intercept air or foreign material from penetrating into the cup part 114.

As shown in FIG. 5, the flange 136 is preferably provided at the bottom with hooks 138 in the number corresponding to that of the projections 120 of the cup part 114. Each of the hooks 138 has an opening 140 for receiving each of the projections 120 and the each projection 120 is extended downward at an inclination and its bottom is projected substantially perpendicularly from the outside wall 116 of the cup part 114. Then, the each hook 138 can be bent owing to self-elasticity to fasten with the each projection 120 along the coupling direction of the lens unit 130 but cannot be easily separated therefrom after being fastened therewith.

By the fastening means constituted of the projections 120, the hooks 138 and the openings 140, the lens unit 130 mounted on the cup part 112 of the body 110 can maintain its position from the external impact even though the resin material 126 does not sufficiently adhere the lens unit 130. That is, when a lens member is placed on the base, the prior art needs additional pressing means for pressing the lens member under a predetermined pressure against the base until the lens member is sufficiently bonded with resin material. However, the fastening means of the present invention eliminate the necessity of such pressing means.

The lens unit 130 may be formed integral by molding transparent epoxy resin or plastic or cutting a member made of molded transparent epoxy resin or plastic.

In the meantime, the lens 132 may contain UV absorbent and/or phosphor. Alternatively, UV absorbent and/or phosphor may be coated on the bottom face of the lens 132.

Further, as not shown in the drawings, the inside wall 118 may be provided with a metal layer of excellent reflectivity to obtain a reflector that more efficiently guides light from the LED chip 102 in an upward direction. Alternatively, a metal film of excellent reflectivity may be attached on the inside wall 118 to do the same purpose.

Hereinafter a method of producing the high power LED package according to the first embodiment of the present invention will be described with reference to process sectional views of FIGS. 6 to 8 together with FIG. 3.

Figure 6:
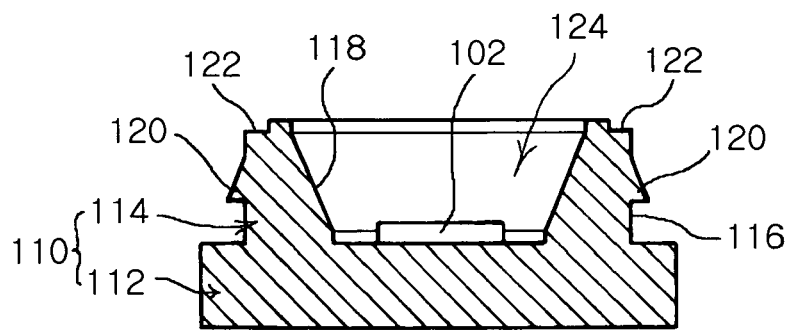
FIGS. 6 to 8 are process sectional views illustrating a method of producing the high power LED package according to the first embodiment of the present invention.

First, a package body 110 as shown in FIG. 6 is formed by molding or cutting a material such as ceramic and plastic, and an LED chip 102 is placed in a cup part 114 of the body 110. The LED chip 102 is bonded to the package body 110 via suitable means such as wire bonding, eutectic bonding and die bonding. In this case, means for electrically connecting the LED chip 102 with an external power supply such as wires are not shown for the convenience's sake. For example, after a circuit (not shown) is formed on a base 112 of the body 110, the LED chip 102 is flip-chip bonded directly to the base 112 and connected to the circuit without the use of a submount.

Figure 7:
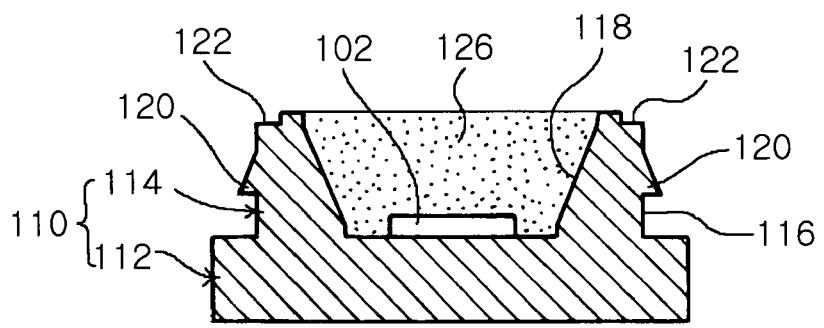

Then, as shown in FIG. 7, resin material 126 such as silicone is dispensed into a cavity 124 of the cup part 114 with a suitable tool such as a dispenser. The quantity of the resin material 126 is preferably determined to fill up the cavity 124 except for a natural vacant region originated from surface tension, and the resin material 126 is dispensed under conditions that may not cure the resin material 126.

Under conditions that does not cure the resin material, voids in the resin material 126 and the cavity 124 are removed via various ways. Since the resin material 126 has a low viscosity, the voids formed of air or gas can be removed via buoyancy or externally vibration. In order to assist such a removal process, the resin material may be filled in a vacuum atmosphere or vibration may be applied during or after dispensing the resin material.

Figure 8:
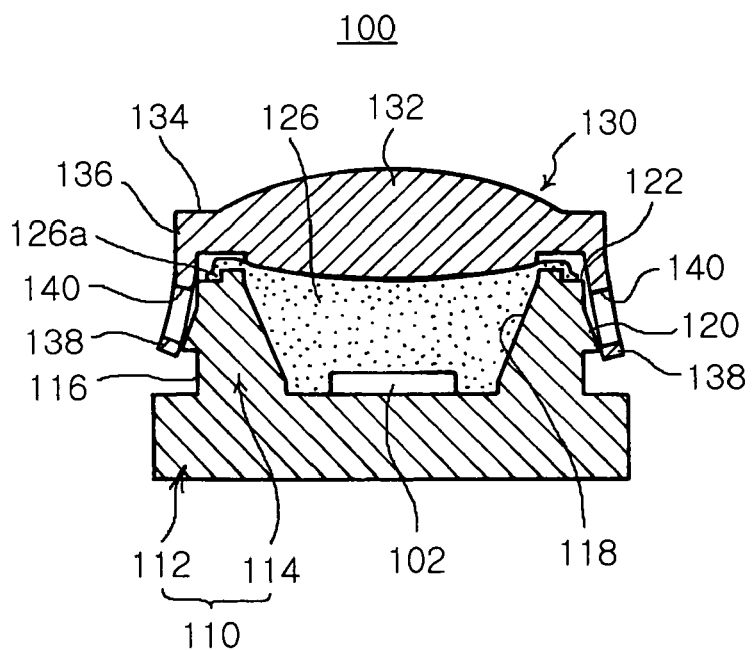

Upon the removal of the voids from the resin material 126 and the cavity 124 through the above process, a lens unit 130 is assembled with the cup part 114 of the package body 110 from above as shown in FIG. 8 and FIG. 3. FIG. 8 illustrates a process of assembling the lens unit 130 to the cup part 114, and FIG. 3 illustrates the state that the lens unit 130 is completely assembled with the cup part 114.

In the assembly process of the lens unit 130 with the cup part 114, the lens unit 130 is moved downward along the normal line of the top face of the cavity 124, and the lens unit 130 is moved downward at a sufficiently small rate so that the resin material 126 can be naturally overflown out of the cavity 124 of the cup part 114 by a convex bottom part of the lens 132.

In response to the downward movement of the lens unit 130, hooks 138 are elastically bent outward along inclinations of individual projections 120 to enable the downward movement of the lens unit 130. While a resin material portion 126a is overflown from the cup part 114 into the step 122, the resin material portion 126a stays in a gap defined by the step 122 and the flange 136 of the lens unit 130 because the flange 136 seals the step 122 from the outside. After being cured, the resin material portion 126a assists the bonding between the lens unit 130 and the cup part 114 via the O-ring effect while preventing external air or foreign material from penetrating into the cup part 114.

Also, the volume of the convex bottom of the lens 132 is determined at least the same as natural vacant region that may be produced during the step in FIG. 7.

Next, the lens unit 130 is moved downward further from the position of FIG. 8 to the position of FIG. 3 so that the hooks 138 fasten with the projections 120 so that the lens unit 130 is stably assembled with the cup part 114. Upon the completion of the assembly process as above, the resin material 126 is cured according to predetermined conditions to produce an LED package 100 as shown in FIG. 3.

Figure 9:
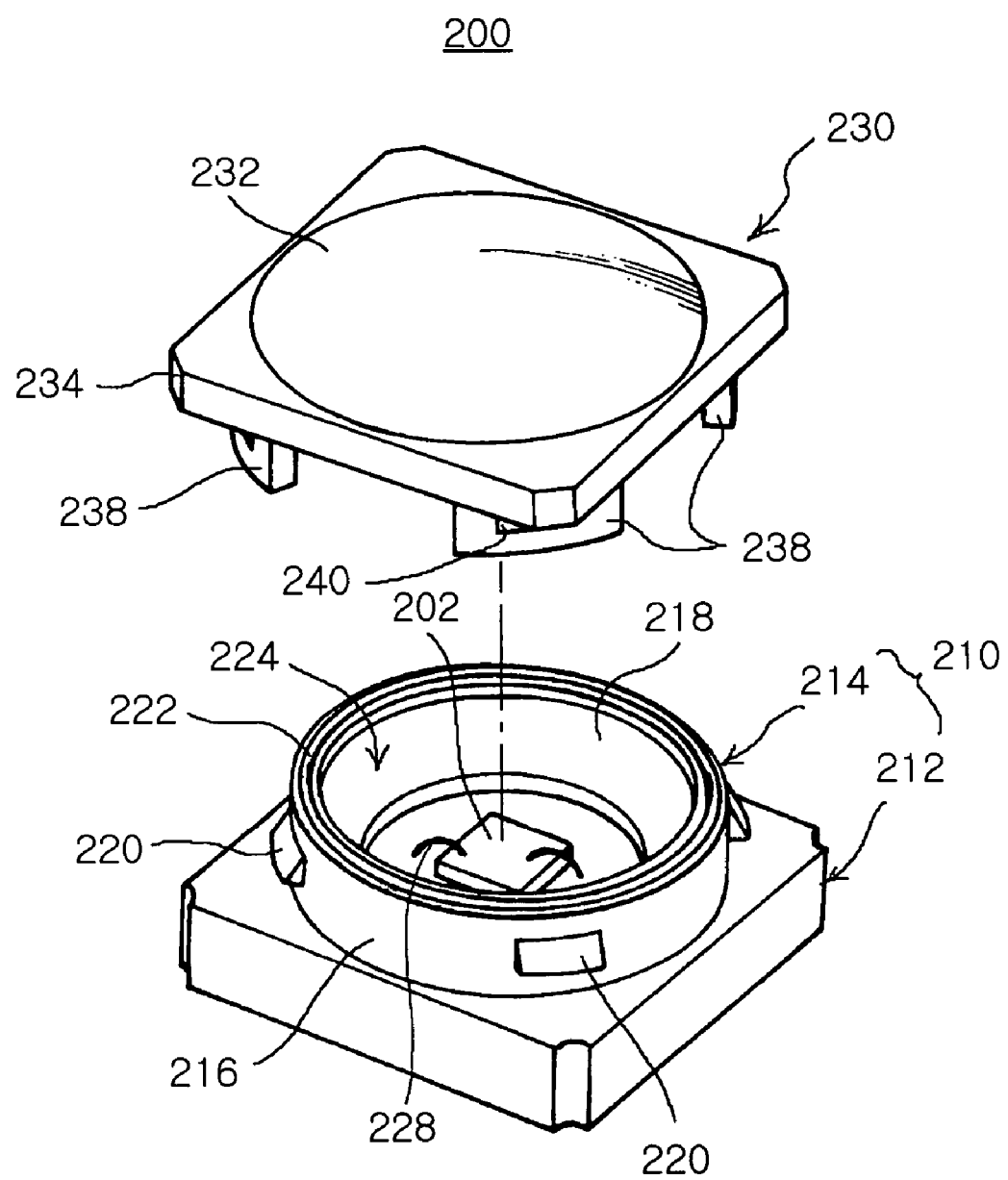
FIG. 9 is an exploded perspective view of a high power LED package according to a second embodiment of the present invention.

FIG. 9 is an exploded perspective view of a high power LED package according to a second embodiment of the present invention, in which the parts having the same function as those of the first embodiment are provided with the same reference numerals, increased by 100.

Referring to FIG. 9, a high power LED package 200 according to the second embodiment of the present invention 200 includes a package body 210 mounted with an LED chip 202, resin material 226 filled into the body 210 while sealing the LED chip 202 and a lens unit 230 fixedly mounted on the body 210.

The LED package 200 of this embodiment has substantially the same construction as the LED package 100 of the first embodiment except that a groove 222 is formed in the top of a cup part 214 of the body 210, and thus the same parts will not be described further.

The groove 222 is formed integrally along the entire top portion of the cup part 214, and cooperates with a downward flange 236 of the lens unit 230 to form a leakage proof structure for preventing leakage of resin material. The groove 222 functions to contain a resin material portion (as represented by the reference number 126a in FIGS. 3 and 8) overflown out of a cavity 224. The groove 222 is structured to have one more outside wall in comparison with the step 122 of the first embodiment. When coupled with the flange 236, the groove 222 is more reliably sealed from the outside thereby to more securely prevent the overflowing resin material portion from leaking to the outside.

While it has been described that the groove 222 is formed integrally along the entire top portion of the cup part 214, the groove 222 may be divided into a plurality of groove parts spaced from one another along the top portion of the cup part 214 on condition that they afford enough spaces to contain the overflowing resin material portion.

The LED package 200 may also have fastening means as described in the first embodiment so that the lens unit may not deviate from its position without additional pressing means while the resin material is cured.

As described above, the present invention provides the LED package capable of preventing the creation of voids in the resin material surrounding the LED chip or the leakage of the resin material to the outside.

For the purpose of this, the present invention provides the step in the upper outer circumference of the cup part of the body mounted with the lens unit and the downward flange in the periphery of the lens to contain the resin material portion in the gap defined between the step and the flange thereby preventing the resin material portion from leaking to the outside. Alternatively, the groove may be provided for the place of the step to more reliably prevent the leakage of the resin material portion to the outside.

Furthermore, the present invention provides the LED package comprising the fastening means which can securely hold the lens unit with respect to the body while the resin material is being cured to bond the lens unit to the body so that the lens unit does not deviate from its position even under external impact.

For the purpose of this, the present invention provides the projections in the outside wall of the cup part and the hooks at the bottom of the downward flange so that the projections are fastened with the hooks, respectively, in order to prevent the lens unit from deviating from its position without the use of additional pressing means while the resin material is being cured.

While the present invention has been shown and described in connection with the preferred embodiments, it will be apparent to those skilled in the art that modifications and variations can be made without departing from the spirit and scope of the present invention as defined by the appended claims.

What is claimed is:

1. A Light Emitting Diode (LED) package comprising:
   an LED chip;
   a resin body having an integral cup part housing the LED chip, the cup part having a step formed in the outer circumference of the top thereof;
   a lens unit mounted on the cup part, said lens unit having a lens and an integral flange extending downward from the outer circumference of the lens along an outside wall of the cup part to form a gap between the flange and the step of the cup part and to seal the gap from the outside;
   resin material filling a space formed between the underside of the lens and the cup part and at least partially the gap formed between the step of the cup part and the lens flange; and
   a fastening arrangement comprising:
      a hook integral with the bottom of the lens flange; and
      a projection which is integral with the outside wall of the resin body and which is configured to be engaged by the hook,
   whereby the resin material is prevented from leaking out of the LED package.

2. The LED package according to claim 1, wherein the step is formed integrally along the entire outer circumference of the top of the cup part.

3. The LED package according to claim 1, wherein the step comprises a plurality of step parts spaced at a predetermined gap along the outer circumference of the top of the cup part.

4. The LED package according to claim 1, wherein the hook and projection are provided in the same number.

5. The LED package according to claim 1, wherein the outer circumference of the lens is laterally projected from the lens and bent downward to form the flange.

6. The LED package according to claim 1, further comprising a submount supporting the LED chip within the space of the cup part.

7. A Light Emitting Diode (LED) package comprising:
   an LED chip;
   a resin body having an integral cup part housing the LED chip, the cup part having a groove formed in the outer circumference of the top thereof;
   a lens unit mounted on the cup part, said lens unit having a lens and an integral flange extending downward from the outer circumference of the lens along the outside wall of the cup part to seal the groove of the cup part from the outside; and
   resin material filling a space formed between the underside of the lens and the cup part and at least partially the groove of the cup part; and
   a fastening arrangement comprising:
      a hook which is integral with a bottom of the lens flange; and
      a projection which is integral with an outside wall of the resin body and which is configured to be engaged by the hook,
   whereby the resin material is prevented from leaking out of the LED package.

8. The LED package according to claim 7, wherein the groove is formed integrally along the entire outer circumference of the top of the cup part.

9. The LED package according to claim 7, wherein the groove comprises a plurality of groove parts spaced at a predetermined gap along the outer circumference of the top of the cup part.

10. The LED package according to claim 7, wherein the hook and projection are provided in the same number.

11. The LED package according to claim 7, wherein the outer circumference of the lens is laterally projected from the lens and bent downward to form the flange.

12. The LED package according to claim 7, further comprising a submount supporting the LED chip within the space of the cup part.

13. A Light Emitting Diode (LED) package comprising:
   a resin body having a recess in which an LED chip is disposed; and
   a lens unit mounted on the resin body to close the recess and to retain a resin material within the recess, the lens unit having a lens a plurality of downwardly depending flanges which are integral with the lens and which are each formed with apertures configured to receive projections that are formed on the resin and which are respectively configured to engage in the apertures and hold lens unit on the resin body.

14. The LED package according to claim 13, wherein the resin body is formed with a step about the recess into which a portion of the resin material can be displaced from the recess when the lens unit is disposed on the resin body, the step being configured to be enclosed by the lens unit so that the resin material which is trapped in the step by the lens unit comprises a sealing gasket.

15. The LED package according to claim 14, wherein the sealing gasket comprises an O-ring.

* * * * *